(12) United States Patent
Yoshida et al.

(10) Patent No.: US 9,824,908 B2
(45) Date of Patent: Nov. 21, 2017

(54) CONVEYING SYSTEM, CONVEYING ROBOT AND TEACHING METHOD OF THE SAME

(71) Applicants: KAWASAKI JUKOGYO KABUSHIKI KAISHA, Kobe-shi, Hyogo (JP); KAWASAKI ROBOTICS (USA), INC., Wixom, MI (US)

(72) Inventors: Hiroyuki Yoshida, Kakogawa (JP); Masaya Yoshida, Himeji (JP); Takao Yamaguchi, Fremont, CA (US); Daniel Chan, San Francisco, CA (US)

(73) Assignees: KAWASAKI JUKOGYO KABUSHIKI KAISHA, Kobe (JP); KAWASAKI ROBOTICS (USA), INC., Wixon, MI (US)

(*) Notice: Subject to any disclaimer, the term of this patent is extended or adjusted under 35 U.S.C. 154(b) by 65 days.

(21) Appl. No.: 14/704,536

(22) Filed: May 5, 2015

(65) Prior Publication Data
US 2016/0325430 A1  Nov. 10, 2016

(51) Int. Cl.
*G06F 7/00* (2006.01)
*H01L 21/68* (2006.01)
*H01L 21/677* (2006.01)

(52) U.S. Cl.
CPC ...... *H01L 21/681* (2013.01); *H01L 21/67766* (2013.01); *Y10S 901/03* (2013.01)

(58) Field of Classification Search
USPC .......................................................... 700/218
See application file for complete search history.

(56) References Cited

U.S. PATENT DOCUMENTS

2013/0053997 A1* 2/2013 Ohashi ............. H01L 21/67742
700/103

FOREIGN PATENT DOCUMENTS

| JP | H09-252039 A | 9/1997 |
| JP | H11-207668 A | 8/1999 |
| JP | 2000-127069 A | 5/2000 |
| JP | 2002-118162 A | 4/2002 |
| JP | 2008-173744 A | 7/2008 |
| JP | 2010151766 A | 7/2010 |

OTHER PUBLICATIONS

Jul. 26, 2016 Search Report issued in PCT Application No. PCT/JP2016/063521.

* cited by examiner

*Primary Examiner* — Kyle Logan
(74) *Attorney, Agent, or Firm* — Oliff PLC

(57) ABSTRACT

In this system, regarding an conveyance object placed on a rotary table, based on positions temporarily set previously as a taking position of the disk-shaped conveyance object in a storing container and a reference position of the rotary table, information of the taking position of the conveyance object in the storing container and of the reference position of the rotary table is acquired based on information of the deviation of the conveyance object placed on the rotary table with respect to the reference position of the rotary table acquired by a sensor portion so as to teach a conveying operation of the conveyance object from the storing container to the rotary table by the robot based on the acquired position information.

10 Claims, 7 Drawing Sheets

CONVEYING SYSTEM, CONVEYING ROBOT AND TEACHING METHOD OF THE SAME

TECHNICAL FIELD

The present invention relates to a conveying system for conveying a disk-shaped conveyance object and its conveying robot, and to a method of teaching a conveying operation of the conveying robot.

BACKGROUND ART

The operation control of an assembling robot and a conveying robot is programmed and executed under a state of grasping and specifying the position and posture of an object (workpiece) based on a robot coordinate system based on the robot mechanism, or the like.

On the other hand, information such as the position and posture of workpieces to be assembled or conveyed and the position of obstacles or the like in the state that the robot does not grasp them is specified based on an outer coordinate system in a static space different from the robot coordinate system such as a world coordinate system and an object coordinate system, for example.

Accordingly, when assembly and conveyance are performed using a robot, the relationship between the robot coordinate system and the external coordinate system needs to be grasped or specified previously. Note that the relationship between the robot coordinate system and the external coordinate system is represented by a coordinate transformation matrix (row and column) of the robot coordinate system and the external coordinate system from a mathematical standpoint.

As a method for specifying the relationship between the robot coordinate system and the external, coordinate system, a method of grasping it by mounting an exclusive jig, a touch sensor, etc. on a robot hand, other than that, a method of using a visual sensor or the like are known, conventionally (Patent Document 1, for example).

However, in the method using the exclusive jig, the teaching operation is manually performed and requires skill and time. Also, the method of using the visual sensor or the like has problems that the measuring accuracy is subject to the environmental light and the hand becomes heavy.

Moreover, particularly when the method of using the exclusive jig and the touch sensor is applied to the robot which handles semiconductors, it may be a cause of generation of dusts and particles due to contact with workpieces or the like since they are used in a clean environment.

RELATED ART DOCUMENTS

Patent Document

[Patent Document 1] Japanese Patent Application Laid-Open No. 2010-151766

SUMMARY OF INVENTION

Problems to be Solved by the Invention

The present invention is made considering the above-stated problems of the conventional technique, and its object is, in the assembly and conveying robots, particularly in a robot for conveying a semiconductor substrate used in a clean environment, to provide a conveying system and its conveying robot capable of obtaining the relationship between the robot coordinate system and the external coordinate system and teaching an operation regarding conveyance without requiring an exclusive jig and also without requiring a special operation different from the usual such as bringing the hand into contact with a portion of a device and a jig, and a teaching method of the conveying robot.

Means for Solving the Problems

In order to achieve the above-stated objects, a conveying system according to a first aspect of the present invention includes: a conveyance object placing device including a rotary table configured to rotate in a horizontal plane, and a sensor portion configured to acquire an information of a deviation of a disk-shaped conveyance object placed on the rotary table with respect to a reference position of the rotary table; and a robot configured to take the disk-shaped conveyance object from a conveyance object storing container so as to convey and place the disk-shaped conveyance object on the rotary table, wherein, regarding the disk-shaped conveyance object placed on the rotary table, based on positions previously and temporarily set as a taking position of the disk-shaped conveyance object in the conveyance object storing container and the reference position of the rotary table, an information of the taking position of the disk-shaped conveyance object in the conveyance object storing container and the reference position of the rotary table is acquired based on the information of the deviation of the disk-shaped conveyance object placed on the rotary table with respect to the reference position of the rotary table acquired by the sensor portion so as to teach a conveying operation of the disk-shaped conveyance object from the conveyance object storing container to the rotary table by the robot based on the information of the positions thus acquired.

The invention according to a second aspect is that, in the first aspect, the information of the deviation of the disk-shaped conveyance object placed on the rotary table with respect to the reference position of the rotary table acquired by the sensor portion comprises following three pieces of information; a deviation of a first placing position, where the disk-shaped conveyance object is placed on the rotary table, with respect to the reference position of the rotary table, based on a previously and temporarily set position as the reference position of the rotary table, a deviation of the disk-shaped conveyance object with respect to the reference position of the rotary table in a second placing position where the disk-shaped conveyance object is moved by the robot horizontally and linearly in a distance previously set from the first placing position and placed on the rotary table, and a deviation of the disk-shaped conveyance object with respect to the reference position of the rotary table in a third placing position where the disk-shaped conveyance object is moved by the robot horizontally and turningly at an angle previously set from the first placing position and placed on the rotary table.

The invention according to a third aspect is that, in the first or second aspect, the reference position of the rotary table is a rotation center of the rotary table, and wherein the deviation of the disk-shaped conveyance object with respect to the reference position of the rotary table is a distance and a direction from the rotation center of the rotary table to the center of the disk-shaped conveyance object.

A teaching method of a conveying operation of a robot in a conveying system according to a fourth aspect of the invention includes: a conveyance object placing device including a rotary table configured to rotate in a horizontal plane, and a sensor portion configured to acquire an information of a deviation of a disk-shaped conveyance object placed on the rotary table with respect to a reference position of the rotary table; and a robot configured to take the disk-shaped conveyance object from a conveyance object storing container so as to convey and place the disk-shaped conveyance object on the rotary table, the method including: a first deviation acquiring step of acquiring a deviation of the disk-shaped conveyance object with respect to the reference position of the rotary table in a first placing position of the disk-shaped conveyance object; a second deviation acquiring step of acquiring a deviation of the disk-shaped conveyance object with respect to the reference position of the rotary table in a second placing position where the disk-shaped conveyance object is moved by a robot linearly in a distance previously set in a horizontal plane from the first placing position and placed on the rotary table; a third deviation acquiring step of acquiring a deviation of the disk-shaped conveyance object with respect to the reference position of the rotary table in a third placing position where the disk-shaped conveyance object is moved by the robot horizontally and turningly at a previously set angle from the first placing position and placed on the rotary table; and a step of acquiring an information of a taking position of the disk-shaped conveyance object in the conveyance object storing container and of a reference position of the rotary table based on the deviation acquired in the first deviation acquiring step and the deviation acquired in the third deviation acquiring step.

The invention according to a fifth aspect is that the reference position of the rotary table is a rotation center of the rotary table, and wherein the deviation of the disk-shaped conveyance object with respect to the reference position of the rotary table is a distance and a direction from the rotation center of the rotary table to a center of the disk-shaped conveyance object.

The present invention according to a sixth aspect is a conveying robot configured to take a disk-shaped conveyance object from a conveyance object storing container so as to convey and place the disk-shaped conveyance object on a rotary table of a conveyance object placing device including a rotary table which rotates in a horizontal plane and a sensor portion which acquires an information of a deviation of the disk-shaped conveyance object placed on the rotary table, wherein an information of a position where the disk-shaped conveyance object is to be taken in the conveyance object storing container and of a position where the disk-shaped conveyance object is to be placed on the rotary table is acquired based on an information of the deviation of the disk-shaped conveyance object placed on the rotary table with respect to the reference position of the rotary table acquired by the sensor portion based on a taking position of the disk-shaped conveyance object in the conveyance object storing container and a position previously and temporarily set as the reference position of the rotary table so that an information of the taking position of the disk-shaped conveyance object in the conveyance object storing container by the robot and of the reference position of the rotary table is acquired based on the information of the positions thus acquired.

The invention according to a seventh aspect is that, in the sixth aspect, the information of the deviation of the disk-shaped conveyance object placed on the rotary table with respect to the reference position of the rotary table acquired by the sensor portion comprises following three pieces of information; a deviation of the disk-shaped conveyance object with respect to the reference position of the rotary table in a first placing position of the disk-shaped conveyance object in the rotary table, a deviation of the disk-shaped conveyance object with respect to the reference position of the rotary table in a second placing position where the disk-shaped conveyance object is moved horizontally and linearly by the robot in a distance previously set from the first placing position and placed on the rotary table, and a deviation of the disk-shaped conveyance object with respect to the reference position of the rotary table in a third placing position where the disk-shaped conveyance object is moved by the robot horizontally and turningly at an angle previously set from the first placing position and placed on the rotary table.

The invention according to an eighth aspect is that, in the sixth or seventh aspect, the reference position of the rotary table is a rotation center of the rotary table, and wherein the deviation of the disk-shaped conveyance object with respect to the reference position of the rotary table is a distance and a direction from the rotation center of the rotary table to a center of the disk-shaped conveyance object.

Advantageous Effect of the Invention

According to the present invention, an exclusive jig or the like is not necessary and a hand does not need to be brought in contact with a device or the like. Therefore, an automatic teaching is possible without the intervention of an operator and also stable and highly precise teaching becomes possible without depending on skills of the operator. Also, the present invention is extremely effective particularly when it is used in a clean environment such as a semiconductor robot since particles are not generated due to contact of a hand.

EMBODIMENT OF THE INVENTION

Hereunder, a conveying system for conveying semiconductor substrates (wafers) will be described as an example. Note that, in the present invention, a conveyance object is not limited to a semiconductor substrate and the invention can be applied to general disk-shaped conveying objects.

Also, robots and other devices are also not limited to the forms and configurations below, as long as they can realize the similar function, or the like.

Figure 1:
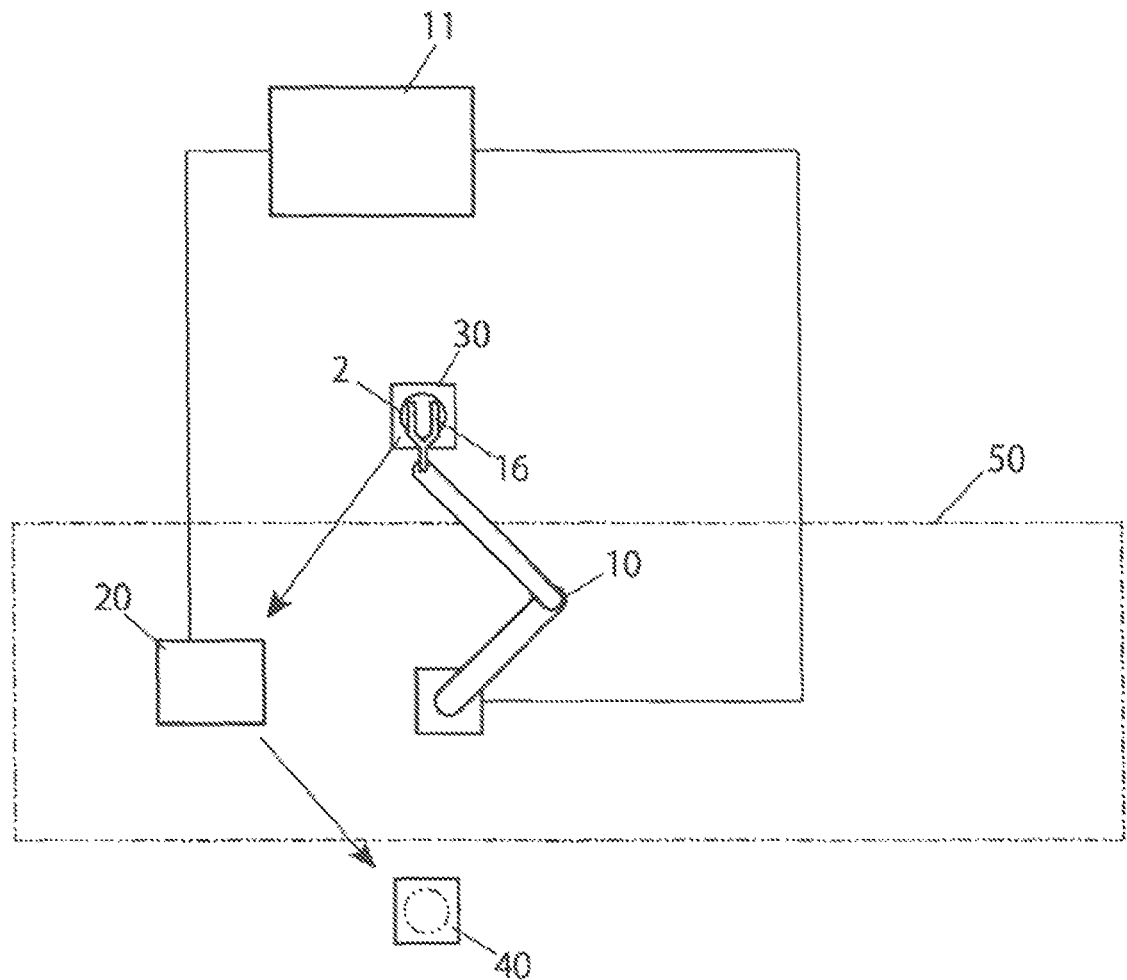
FIG. 1 is a schematic block diagram illustrating a conveying system according to an embodiment of the present invention.

As illustrated in FIG. 1, the conveying system 1 according to this embodiment includes a robot 10, its robot control device 11, a substrate positioning device 20 such as an aligner, and a substrate storing container 30 such as a FOUP.

First, a semiconductor substrate (hereunder, mainly referred to as simply "substrate") as a conveyance object (conveyed object) of the conveying system according to this embodiment will be described.

The substrate 2 is in a thin disk-shaped form with a single-crystal structure, and in order to treat the substrate 2 in a process chamber 40, the substrate 2 needs to be placed in a process device of the process chamber 40 accurately positioning its position and the direction of its crystal structure. Generally, the following method is employed as a positioning method. With regard to the position, centering for aligning the center of the substrate to a reference point on the process device is used. With regard to the direction of a crystal, axis, the positioning is performed by matching a cut-away section (notch) provided in an end portion on the circumference in the radial direction corresponding to the direction of the crystal axis with a predetermined position or a direction of the process device or the like.

The robot 10 follows instructions from the robot control device 11 so as to perform the transfer of the substrate 2 from the substrate storing container 30 to the substrate positioning device (hereunder, referred to as "aligner") 20, the transfer from the aligner 20 to the process chamber 40, and other transfers and handlings.

The substrate storing container 30 is a container in the shape of a box capable of storing one or a plurality of substrates 2, specifically, it is a container called FOUP (Front-Opening Unified Pod) which is specified by the SEMI standard, which is hereunder called "FOUP".

Figure 2:
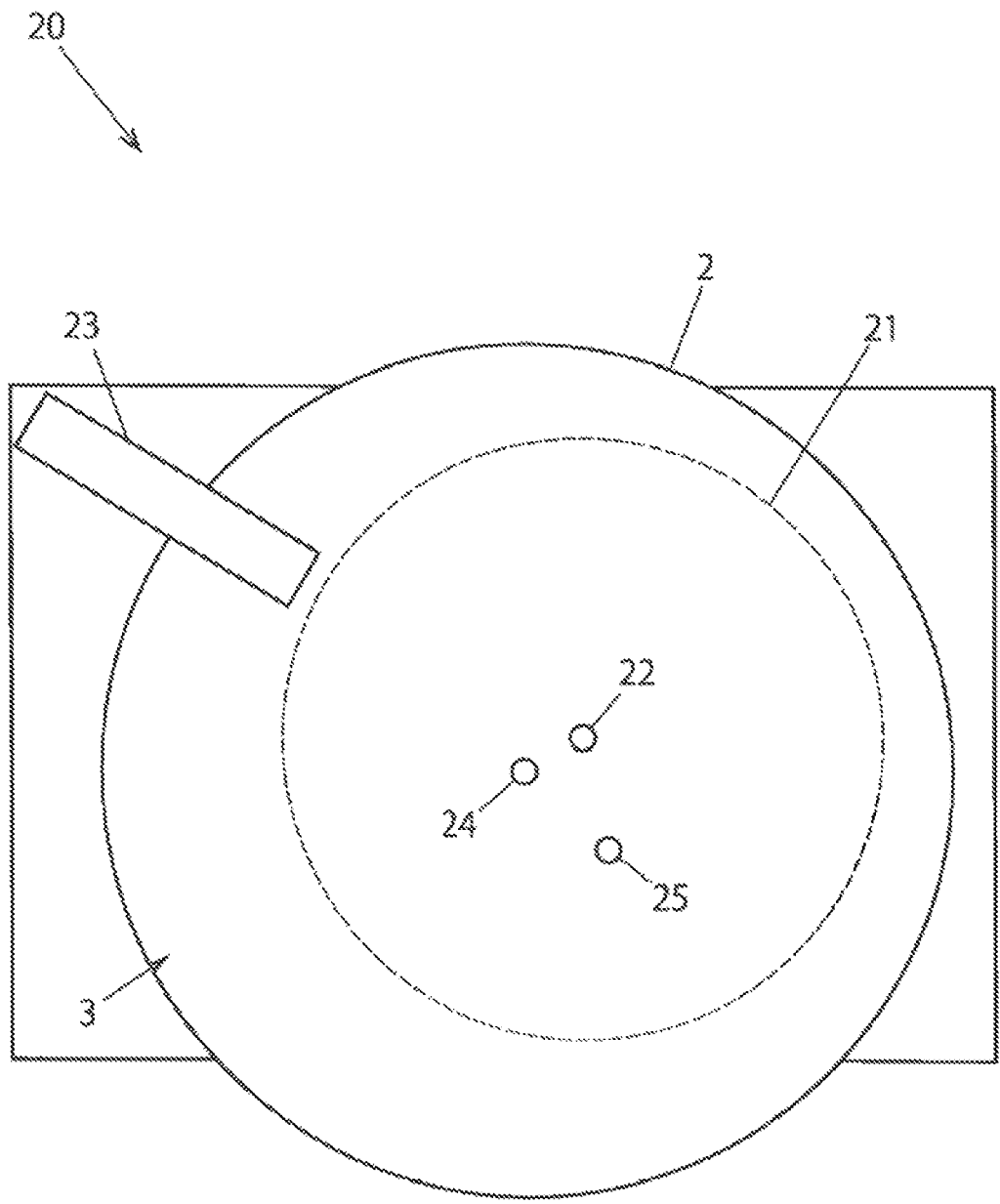
FIG. 2 is a schematic block diagram illustrating a substrate positioning device in the embodiment illustrated in FIG. 1.

As illustrated in FIG. 2, the aligner 20 has a rotary table 21 rotating about the rotational axis center, and detects the center position of the substrate 2 placed on the rotary table 21 and the direction (angle) of the center position with respect to the aligner 20 using a sensor portion 23, and/or performs a predetermined positioning about the center of the substrate 2 with respect to the aligner 20 or the robot 10.

Also, the aligner 20 may detect a notch position in the outer circumferential portion of the substrate 2 and performs a predetermined positioning of the notch of the substrate 2 with respect to the aligner 20 and/or the robot 10.

<Robot>

Summary of the robot 10 in this embodiment will be described using FIG. 3.

Figure 3:
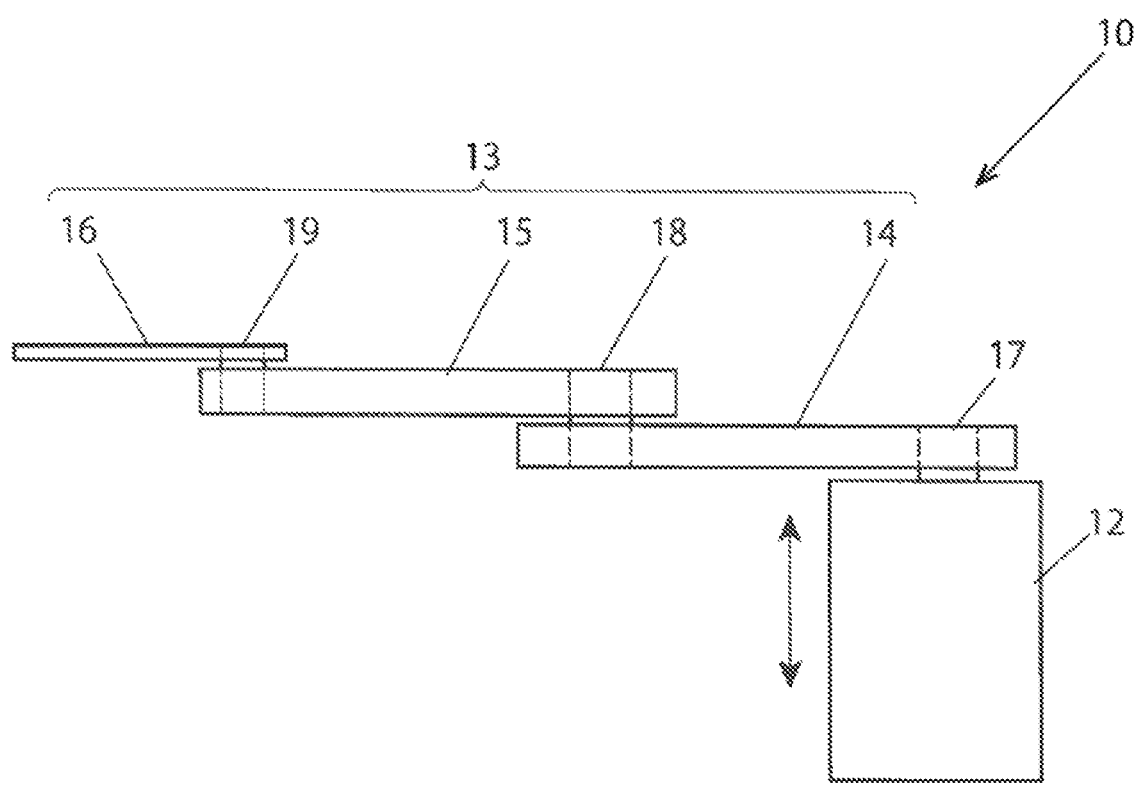
FIG. 3 is a schematic view illustrating a robot in the embodiment illustrated in FIG. 1.

As illustrated in FIG. 3, the robot 10 in this embodiment includes a base 12 and an arm portion 13, and the arm portion 13 is a horizontal (turning) articulated robot having two arms (a first arm 14 on the base side and a second arm 15 connected to the first arm 14) horizontally turning about a vertical axis as the center. Also, the second arm 15 of the arm portion 13 has a hand 16 for holding the substrate 2 as a conveyed object. Note that the axis configuration of the robot in this embodiment is not limited to the horizontal turning type and any robots capable of moving in a horizontal plane and positioning may be used.

A vacuum suction type hand or the like is used as the hand 16.

The base 12 has an elevating mechanism for elevating the arm 13.

Next, the mechanism and operation of the robot 10 will be described specifically.

A proximal portion of the first arm 14 is coupled to the upper portion of the base 12 rotationally by a first rotation shaft 17, a proximal portion of the second arm 15 is coupled to the distal end portion of the first arm 14 rotationally by a second rotation shaft 18, and a proximal portion of the hand 16 is coupled to the distal end portion of the second arm 15 rotationally by a third rotation shaft 19.

These rotation shafts are capable of operation control of positioning and speed independently from each other and drivingly controlled via a drive device such as a motor and a reduction gear.

The robot 10 is capable of controlling the movement and posture (direction (angle) the hand faces) in a horizontal plane and the movement in the vertical direction of the hand 16 by the mechanism above. Accordingly, by using the robot 10, the substrate 2 can be taken out of the FOUP 30 and conveyed to the aligner 20, the substrate 2 placed on the aligner 20 can be conveyed to the process chamber 40, and other conveyance can be performed.

Note that all of the conveyance of the substrate 2 described above may be performed using the same single robot 10, or using a plurality of robots 10. Different robots may be used. For example, the first robot 10 is used for the conveyance from the FOUP 30 to the aligner 20 and the second robot 10 is used for the conveyance from the aligner 20 to the process chamber 40.

<Aligner>

Since the substrate 2 has a predetermined crystal structure as described above, the substrate 2 needs to be conveyed and placed so as to ensure the center position and the crystal axis direction of the substrate 2 in the process device of the process chamber 40 in order to treat the substrate 2 in the process chamber 40.

However, regarding the substrate 2 stored in the FOUP 30, its center position and the direction of the notch corresponding to the crystal axis direction are not exactly positioned, and therefore the center position and the notch direction of the substrate 2 held by the robot 10 with the hand 16 for conveyance with respect to the hand 16 cannot be grasped.

Therefore, the substrate 2 cannot be conveyed to the process chamber 4 and placed therein so as to ensure the predetermined center position and notch direction thereof.

Accordingly, the aligner 20 is used in order to convey the substrate 2 in the FOUP 30, whose exact position and direction cannot be grasped, to the aligner 20 and to detect and specify the predetermined center position and notch direction of the same with respect to the hand 16 and/or to position the same in the predetermined position and direction.

Therefore, the aligner 20 has the function of detecting or specifying the magnitude and/or direction of the deviation (hereunder, referred to as "total offset") of the center of the substrate 2 with respect to the rotation center (hereunder, referred to as "aligner reference point") of the rotary table 21, regarding the substrate 2 placed on the rotary table 21. Moreover, the aligner 20 may be used in order to match the center of the substrate 2 with the aligner reference point and/or position the notch of the substrate 2 in the predetermined direction.

As illustrated in FIG. 2, the aligner 20 is provided with a rotary table 21 capable of rotating the substrate 2 placed thereon and positioning the same at a predetermined angle, and a sensor portion 23 for detecting the position of the notch 3.

First, detection of the position of the notch will be described.

In the sensor portion 23, a light projecting portion (not illustrated) is arranged above (or below) the substrate 2 and a light receiving portion (not illustrated) is arranged below (or above) the substrate 2, and the light receiving portion receives the irradiation light from the light projecting portion, in the outer peripheral portion of the substrate 2 placed on the rotary table 21.

Although the irradiation light from the light projecting portion is intercepted by the substrate 2, the light interception is reduced in the notch part and the light quantity received by the light receiving portion is increased. Then, the position of the notch is detected based on the change in light quantity with respect to the substrate 2 rotated by the rotary table 21.

Next, a detection method of the magnitude and angle of the position deviation (total offset) of the substrate 2 with respect to the rotation center of the rotary table 21 will be described.

Figure 4:
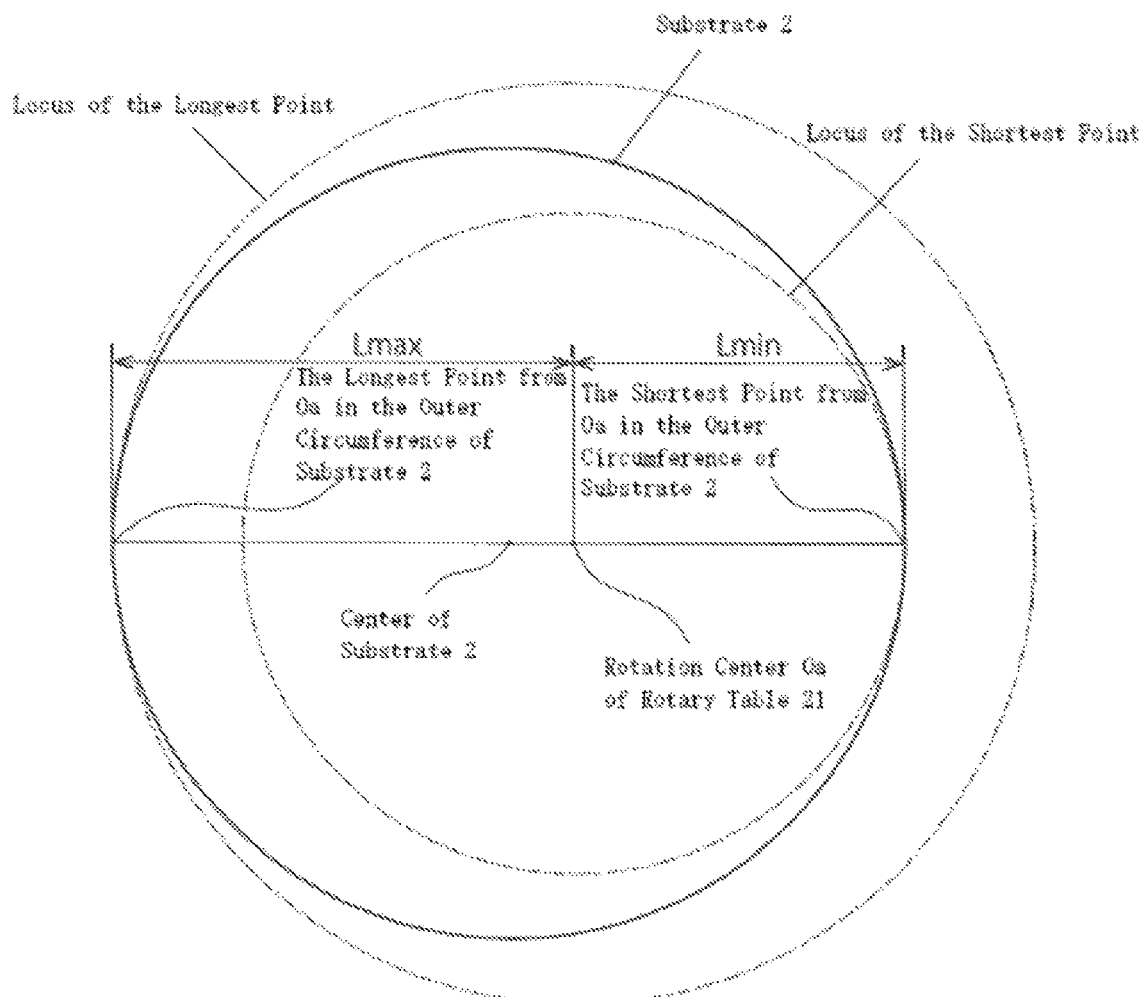
FIG. 4 is an explanatory drawing illustrating how a deviation amount of the center position of a semiconductor substrate with respect to the center of a rotary table of a substrate positioning device is detected in the embodiment illustrated in FIG. 1.

As illustrated in FIG. 4, with the rotation center (aligner reference point) of the rotary table 21 as a reference, a distance L from the reference to the outer peripheral portion end surface of the substrate 2 placed on the rotary table 21 is on the straight line connecting the center of the rotary table 21 and the center of the substrate 2, and one which is in the direction to the center of the substrate 2 from the center of the rotary table 21 is the longest (the specific longest distance $L_{max}$=radius of substrate 2+deviation amount), while one which is in the opposite direction is the shortest (the specific shortest distance $L_{min}$=radius of substrate 2−deviation amount). The distance L changes continuously according to the rotation of the rotary table 21 between the longest point and the shortest point. Note that $L_{max}-L_{min}$=2×deviation amount.

Accordingly, based on the change in received light quantity of the light receiving portion in the sensor portion 23 corresponding to the rotation of the rotary table 21, the direction (angle) of the center direction of the substrate 2 with respect to the center of the rotary table 21, namely the direction of the total offset can be detected by the rotation angle of the rotary table 21 at which the light quantity becomes maximum and/or minimum.

Also, the longest distance $L_{max}$ or the shortest distance $L_{min}$ increases or decreases respectively corresponding to the increase of the magnitude of the position deviation of the center of the substrate 2 with respect to the center of the rotary table 21 as stated above, and therefore the position deviation amount, namely the magnitude of the total offset is detected based on the magnitude of the absolute value of the received light quantity of the light receiving portion of the sensor portion 23 at the longest point and/or shortest point.

Note that, for detecting the position deviation more exactly, it is desirable that the change in received light quantity can be detected more precisely or more exactly. Thus, it is desirable to use the linear array sensor for linearly arranging a plurality of light emitting elements and light receiving elements in the corresponding light projecting portion and light receiving portion.

Note that, although the description above describes that the same sensor portion 23 is used for detecting the notch position and measuring the position deviation amount, a separate sensor portion, namely a sensor portion 23a or a sensor portion 23b may be provided for each.

<Relationship Between Robot Coordinate System and Aligner Coordinate System>

Figure 5:
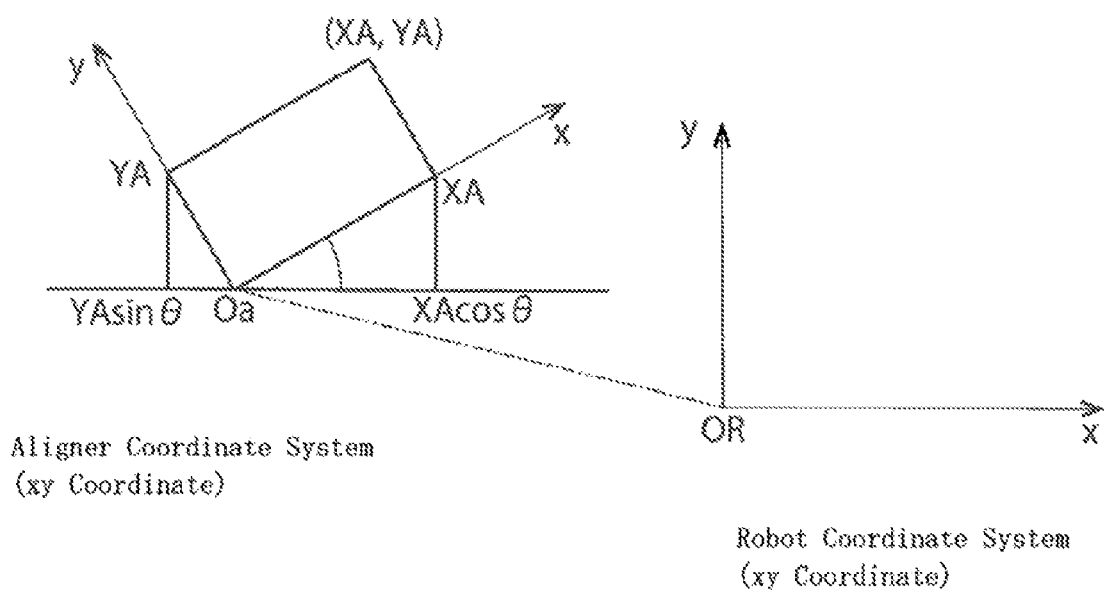
FIG. 5 is a view illustrating the relationship between an aligner coordinate system and a robot coordinate system in the embodiment illustrated in FIG. 1.

The relationship between the robot coordinate system and the aligner coordinate system will be described referring to FIG. 5.

Since the robot 10 according to this embodiment is a horizontal turning articulated type and the aligner 20 also has a mechanism turning in the horizontal plane, it can be considered that operations such as positioning or the like of the robot 10 and the aligner can be performed in the horizontal plane basically. Accordingly, the xy coordinate systems of both the robot coordinate system and the aligner coordinate system will be considered. Hereunder, thus, the robot coordinate system and the aligner coordinate system represent the xy coordinate system of the robot coordinate system and the xy coordinate system of the aligner coordinate system respectively unless otherwise specifically stated.

Regarding the robot coordinate system and the aligner coordinate system, generally there is the relative angle (θ) between the deviation of the origin (hereunder, referred to as "origin offset") and both coordinate axes. Therefore, when the coordinate $(X_A, Y_A)^T$ in the aligner coordinate system is represented using the coordinate $(X_R, Y_R)^T$ in the robot coordinate system, the following formula is established.

$$\begin{pmatrix} X_R \\ Y_R \end{pmatrix} = \begin{pmatrix} \cos\theta & -\sin\theta \\ \sin\theta & \cos\theta \end{pmatrix} \begin{pmatrix} X_A \\ Y_A \end{pmatrix} = O_o \qquad \text{[formula 1]}$$

Here, note that $O_o$ is an origin offset vector, specifically it is the vector with the robot coordinate system origin as a start point and the aligner coordinate system origin as an end point, and also it is specifically the coordinate $(X_C, Y_C)R^T$ represented by the robot coordinate system of the aligner coordinate system origin $O_a(X_C, Y_C)^T$.

Note that a matrix H represented by the following formula is referred to as the coordinate transformation matrix of the robot coordinate system and the aligner coordinate system.

$$H = \begin{pmatrix} \cos\theta & -\sin\theta \\ \sin\theta & \cos\theta \end{pmatrix} \qquad \text{[formula 2]}$$

When the origin offset (vector) $O_o$ and the transformation matrix H are defined, the position in the aligner coordinate system can be specified as the position in the robot coordinate system or the position in the robot coordinate system can be specified as the position in the aligner coordinate system. Therefore, in the robot teaching operation such as handling, conveyance, or the like, the operation obtaining the origin offset and the coordinate transformation matrix is needed, and this operation may be called calibration.

Conventionally, on the other hand, this operation used to be performed using jigs or the like, and there have been problems of the operation requiring skill as stated above and the like.

Thus, in this embodiment, the operation is made efficient and simplified by the following method.

Next, the procedure of the robot teaching will be described based on the above.

<Procedure of Robot Teaching>

Figure 6:
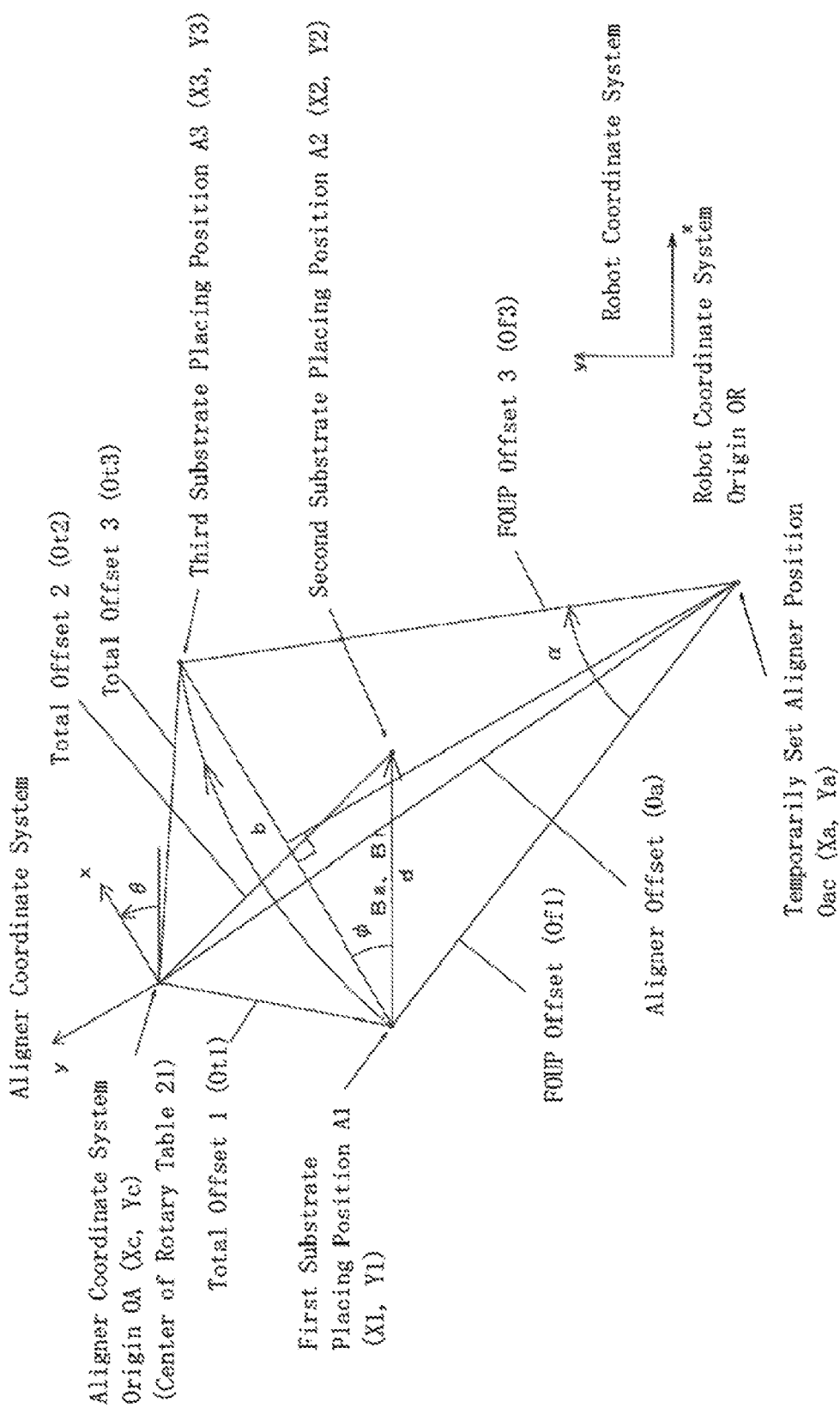
FIG. 6 is a view illustrating teaching points and operating points such as center positions of a robot and a substrate in an aligner in the embodiment illustrated in FIG. 1.

The teaching procedure using the robot 10, the aligner 20, the substrate 2, and the FOUP 30 will be described referring to FIG. 6. Note that FIG. 6 illustrates teaching points and operation points such as the center positions of the robot 10 and the substrate 2 in the aligner 20.

Step 1

The substrate 2 is stored in the FOUP 30 such that the center of the substrate 2 is correctly arranged.

Step 2

The substrate 2 is taken out of the FOUP 30 by the robot 1 based on a FOUP position $P_0$ (hereunder, referred to as "temporarily set FOUP position") set temporarily set previously as a taking position in the FOUP 30. Here, as $P_0$ is the temporarily set FOUP position for taking out the substrate 2, the center position of the substrate 2 is not grasped by the robot 10.

Note that the temporarily set FOUP position is specified in the robot coordinate system.

Step 3

The substrate 2 is conveyed and placed on the rotary table 21 of the aligner 20 by the robot 10 based on an aligner position $O_{ao}$ (hereunder, referred to as "temporarily set aligner position") which is temporarily set previously as the reference position of the rotary table 21 (rotation center of rotary table). Hereunder, the center position of the substrate 2 placed on the rotary table 21 based on the temporarily set aligner position is referred to as "first substrate placing position" which is represented by $A_1$, and the coordinates in the robot coordinate system is represented by $(X_1, Y_1)^T$.

As the first substrate placing position $A_1$ is placed on the aligner using the temporarily set FOUP position $P_0$ and the temporarily set aligner position $O_{ac}$, it is deviated from an aligner coordinate system origin $O_a$. A deviation of the first substrate placing position $A_1$ from the aligner coordinate system origin $O_a$ (hereunder, referred to as "total offset 1")(vector) $O_{t1}$ is the sum of the deviation of the temporarily set FOUP position $P_0$ (hereunder, referred to as "FOUP offset 1") (vector) with respect to a true FOUP position P (hereunder, referred to as "true FOUP position") from which the substrate 2 is to be taken out in the FOUP 30 and the deviation of the temporarily set aligner position $O_{ac}$ (hereunder, referred to as "aligner offset") (vector) with respect to the aligner coordinate system origin $O_a$.

Note that the temporarily set aligner position $O_{ao}$ is specified by the robot coordinate system.

Also, in the robot coordinate system, the true FOUP position P and an aligner reference point (aligner coordinate system origin) $O_a$ are unknown, and therefore all of a FOUP offset 1 ($O_{f1}$), the aligner offset ($O_a$), and the total offset 1 ($O_{t1}$) are unknown at this time.

Step 4

By the method previously described in <aligner>, namely, by rotating the rotary table 21, the sensor portion 23 measures the magnitude of the total offset 1 ($O_{t1}$) and its direction (angle) in the first substrate placing position $A_1$ based on the longest distance $L_{max}$ and/or the shortest distance $L_{min}$.

Note that, as the measurement value of the total offset 1 ($O_{t1}$) has been measured in the aligner coordinate system, its coordinates have been specified as the aligner coordinate system.

Step 5

The rotary table 21 is rotated so as to return the center position of the substrate 2 to the first substrate placing position $A_1$.

Step 6

The substrate 2 on the rotary table 21 is held by the robot hand 16, and the substrate 2 is moved in a distance d which is previously set in a direction in parallel with the X-axis in the robot coordinate system and placed on the rotary table 21 using the robot 10. The center position of the substrate 2 after the movement is represented by a second substrate placing position A2, and its coordinates in the robot coordinate system is represented by $(X_2, X_2)^T$. Note that, in this embodiment, the moving direction of the substrate 2 by the robot 10 is in parallel with the X-axis in order to simplify variations and induction of the formulas below, and the moving direction may be an arbitrary direction as long as the previously set distance d can be specified in principal or from a mathematical standpoint.

Step 7

By the method previously described in <aligner>, namely, by rotating the rotary table 21, the magnitude and direction of the position deviation of the center of the substrate 2 (vector) (hereunder, referred to as "total offset 2") $O_{t2}$ with respect to the aligner coordinate system origin in the second substrate placing position $A_2$ are measured based on the longest distance $L_{max}$ and/or the shortest distance $L_{min}$.

Note that, as the measurement value of the total offset 2 ($O_{t2}$) has been measured in the aligner coordinate system, its coordinates have been specified as the aligner coordinate system.

Figure 7:
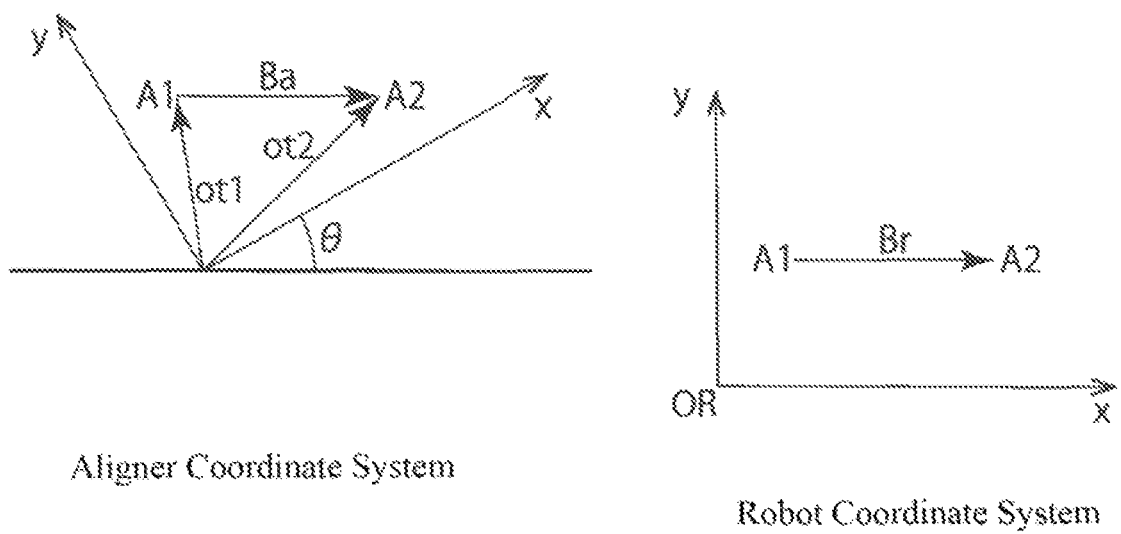
FIG. 7 is a view illustrating calculation of the relative angle of the aligner coordinate system and the robot coordinate system in the step 7 of the teaching procedure of the robot in the embodiment illustrated in FIG. 1.

Next, a movement vector from the first substrate placing position $A_1$ to the second substrate placing position $A_2$ of the substrate 2 will be specified in the aligner coordinate system and the robot coordinate system referring to FIG. 7, and the relationship will be considered.

The total offset 1 ($O_{t1}$) is a position deviation (total offset 1) vector of the substrate center in the first substrate placing position $A_1$.

$B_a$ is the movement vector in the aligner coordinate system with regard to the movement of the substrate 2 from the first substrate placing position $A_1$ to the second substrate placing position $A_2$, and $B_r$ is the movement vector in the robot coordinate system with regard to the movement. Note that, although these two movement vectors are the same physically, the movement vector ($B_r$) in the robot coordinate system is known, while the movement vector ($B_a$) in the aligner coordinate system is not known.

Here, since the total offset 1 ($O_{t1}$) has been specified by the step 4 and the total offset 2 ($O_{t2}$) has been specified by the measurement in this step, and both of them have been known, the movement vector $B_a$ in the aligner coordinate system can be obtained from $B_a = O_{t2} - O_{t1}$ (aligner coordinate system on the left in FIG. 7).

Also, as stated above, $B_r$ and $B_a$ are the same physically. Therefore, the relationship between $B_r$ and $B_a$ can be represented by the following formula using the coordinate transformation matrix H in the aligner coordinate system and the robot coordinate system.

$$B_a = HB_r \qquad \text{[formula 3]}$$

Here, $B_r = (d, 0)^T$ is established, provided $B_a = (X_{a1}, Y_{a1})^T$. Thus, the relative angle θ of the aligner coordinate system and the robot coordinate system can be obtained by the following formula derived from the formula 3.

$$\tan \theta = Y_{a1}/X_{a1} \qquad \text{[formula 4]}$$

Accordingly, the coordinate transformation matrix H of the aligner coordinate system and the robot coordinate system can be obtained by substituting θ calculated by the formula 4 into the formula 2.

Step 8

The substrate 2 is held by the hand 16 of the robot 10 and returned to the first substrate placing position $A_1$. Accordingly, the center position of the substrate 2 at this time is $A_1$.

Step 9

The hand 16 is rotated by a previously set angle α about a straight line passing through the temporarily set aligner position ($O_{ac}$) and in parallel with the Z line.

Step 10

When the rotation of the angle α is finished, the substrate 2 is placed on the rotary table 21. The center position of the substrate 2 at this time is represented by a third substrate placing position $A_3$, and the coordinates in the robot coordinate system is represented by as $(X_3, Y_3)^T$.

Step 11

By the method previously described in <aligner>, namely, by rotating the rotary table 21, the sensor portion 23 measures the magnitude and direction of the substrate center position deviation (total offset 3) $O_{t3}$ in the third substrate placing position $A_3$ based on the longest distance $L_{max}$ and/or the shortest distance $L_{min}$.

The total offset 1 ($O_{t1}$) and the total offset 3 ($O_{t3}$) in the aligner coordinate system are known according to the measurement by the aligner (step 4 and step 7).

On the other hand, the aligner offset ($O_a$), the FOUP offset 1 ($O_{f1}$), and the FOUP offset 3 ($O_{f3}$) in the robot coordinate system are unknown. Here, the aligner offset is the deviation of the temporarily set aligner position $O_{ac}$ with respect to the aligner coordinate system origin (center of rotary table 21), and also is a vector with the aligner coordinate system origin $O_a$ as a start point and the temporarily taught aligner position $O_{ac}$ as an end point.

In the above, there are three unknown quantities, and therefore three equations are needed in order to obtain these unknown quantities.

The total offset 1 ($O_{t1}$) and the total offset 3 ($O_{t3}$) are the vector sum of the FOUP offset 1 ($O_{f1}$) and the aligner offset ($O_a$), and the sum of the FOUP offset 3 ($O_{f3}$) and the aligner offset ($O_a$), respectively, and therefore the relationship below is established.

$$O_{t1} = O_{f1} + O_a \quad [\text{formula 5}]$$

$$O_{t3} = O_{f3} + O_a \quad [\text{formula 6}]$$

Also, as the third substrate placing position $A_3$ is generated by rotating the hand 16 of the robot 10 with the temporarily set aligner position $O_{ac}$ as the center, $O_{f1}$ is the same degree (absolute value) as $O_{f3}$. Thus, $|O_{f1}|=|O_{f3}|=O_f$ is established.

Accordingly, the following relative equation is derived from the fact that the triangle formed of the point $O_{ac}$, point $A_1$, and point $A_3$ is an isosceles triangle with the point $O_{ac}$ as the vertex.

$$(X_3 - X_1)^2 + (Y_3 - Y_1)^2 = b^2 \quad [\text{formula 7}]$$

$$\frac{b}{2} = O_f \sin\frac{\alpha}{2} \quad [\text{formula 8}]$$

$$\tan\varphi = \frac{Y_3 - Y_1}{X_3 - X_1} \quad [\text{formula 9}]$$

Here, φ represents the angle formed by the vector extending from the point $A_1$ to the point $A_3$ and the X-axis (positive) direction of the robot coordinate system, and b represents the distance between the first substrate placing position $A_1$ and the third substrate placing position $A_3$.

Degree of b, $O_f$ ($O_{f1}$), and φ can be obtained by the formula 7 or the formula 9, respectively.

Accordingly, the value of the coordinates $(X_a, Y_a)^T$ of the temporarily set aligner position $O_{ao}$ can be obtained from these values using the following formulas.

$$X_a = X_1 + O_f \cos\left(90 - \frac{\alpha}{2} - \varphi\right) \quad [\text{formula 10}]$$

$$Y_a = Y_1 + O_f \sin\left(90 - \frac{\alpha}{2} - \varphi\right) \quad [\text{formula 11}]$$

The FOUP offset 1 ($O_{f1}$) can be obtained by the following formula using these coordinate values.

$$O_{f1} = \binom{X_1}{Y_1} - \binom{X_a}{Y_a} \quad [\text{formula 12}]$$

Accordingly, the true FOUP position P can be obtained by adding $O_{f1}$ obtained by the formula 12 to the temporarily set FOUP position $P_0$.

Also, the aligner coordinate system origin $O_a$ as a position A in which the substrate is to be truly placed (hereunder, referred to as "true aligner placing position") in the aligner 20, namely the coordinates $(X_c, Y_c)^T$ of the center position of the rotary table 21 can be obtained by the following formula.

$$\binom{X_c}{Y_c} = O_{f1} + O_{t1} + \binom{X_a}{Y_a} \quad [\text{formula 13}]$$

As a result of the above, the true FOUP position and the true aligner placing position A can be obtained as teaching information, and therefore an exact conveying operation by the robot can be performed (reproduced) using these teaching positions.

According to this embodiment, following advantageous effects can be realized.

The teaching operation becomes possible without requiring teaching jigs or the like. Therefore the system can be simplified and also information of hands or the like is not needed for control, thereby facilitating control.

There is no need to bring teaching jigs or the like into contact with a device, therefore particularly for a robot which is used under clean environment, the generation of particles due to contact can be prevented.

An automatic teaching is possible without intervention of an operator, and a teaching with high accuracy becomes possible without depending on skills of the operator.

DESCRIPTION OF REFERENCE NUMERALS

1 . . . conveying system
2 . . . semiconductor substrate (wafer)
3 . . . notch
10 . . . robot
11 . . . robot control device
12 . . . base
13 . . . arm portion
14 . . . first arm
15 . . . second arm
16 . . . hand
17 . . . first rotation axis
18 . . . second rotation axis
19 . . . third rotation axis 20 . . . substrate positioning device (aligner)
21 . . . rotary table
22 . . . rotation center of rotary table
23 . . . sensor portion
24 . . . first substrate placing position
25 . . . temporarily set aligner position
30 . . . substrate storing container (FOUP)
40 . . . process chamber

The invention claimed is:

1. A conveying system comprising:
a conveyance object placing device comprising:
  a rotary table configured to rotate in a horizontal plane; and
  a sensor portion configured to acquire an information of a deviation of a disk-shaped conveyance object placed on the rotary table with respect to a reference position of the rotary table; and
a robot configured to take the disk-shaped conveyance object from a conveyance object storing container so as to convey and place the disk-shaped conveyance object on the rotary table,
wherein an information of a position where the disk-shaped conveyance object is to be taken in the conveyance object storing container and of a position where the disk-shaped conveyance object is to be placed on the rotary table is acquired based on an information of the deviation of the disk-shaped conveyance object placed on the rotary table with respect to the reference position of the rotary table acquired by the sensor portion based on a taking position of the disk-shaped conveyance object in the conveyance object storing container and a position previously and temporarily set as the reference position of the rotary table so that an information of the taking position of the disk-shaped conveyance object in the conveyance object storing container by the robot and of the reference position of the rotary table is acquired based on the information of the positions thus acquired.

2. The conveying system according to claim 1,
wherein the reference position of the rotary table is a rotation center of the rotary table, and
wherein the deviation of the disk-shaped conveyance object with respect to the reference position of the rotary table is a distance and a direction from the rotation center of the rotary table to the center of the disk-shaped conveyance object.

3. The conveying system according to claim 1,
wherein the information of the deviation of the disk-shaped conveyance object placed on the rotary table with respect to the reference position of the rotary table acquired by the sensor portion comprises:
a deviation of a first placing position, where the disk-shaped conveyance object is placed on the rotary table, with respect to the reference position of the rotary table, based on a previously and temporarily set position as the reference position of the rotary table,
a deviation of the disk-shaped conveyance object with respect to the reference position of the rotary table in a second placing position where the disk-shaped conveyance object is moved by the robot horizontally and linearly in a distance previously set from the first placing position and placed on the rotary table, and
a deviation of the disk-shaped conveyance object with respect to the reference position of the rotary table in a third placing position where the disk-shaped conveyance object is moved by the robot horizontally and turningly at an angle previously set from the first placing position and placed on the rotary table.

4. The conveying system according to claim 3,
wherein the reference position of the rotary table is a rotation center of the rotary table, and
wherein the deviation of the disk-shaped conveyance object with respect to the reference position of the rotary table is a distance and a direction from the rotation center of the rotary table to the center of the disk-shaped conveyance object.

5. A teaching method of a conveying operation of a robot in a conveying system, the system comprising:
a conveyance object placing device comprising:
  a rotary table configured to rotate in a horizontal plane; and
  a sensor portion configured to acquire an information of a deviation of a disk-shaped conveyance object placed on the rotary table with respect to a reference position of the rotary table; and
a robot configured to take the disk-shaped conveyance object from a conveyance object storing container so as to convey and place the disk-shaped conveyance object on the rotary table,
the method comprising:
a first deviation acquiring step of acquiring a deviation of the disk-shaped conveyance object with respect to the reference position of the rotary table in a first placing position of the disk-shaped conveyance object;
a second deviation acquiring step of acquiring a deviation of the disk-shaped conveyance object with respect to the reference position of the rotary table in a second placing position where the disk-shaped conveyance object is moved by a robot linearly in a distance previously set in a horizontal plane from the first placing position and placed on the rotary table;
a third deviation acquiring step of acquiring a deviation of the disk-shaped conveyance object with respect to the reference position of the rotary table in a third placing position where the disk-shaped conveyance object is moved by the robot horizontally and turningly at a previously set angle from the first placing position and placed on the rotary table; and
a step of acquiring an information of a taking position of the disk-shaped conveyance object in the conveyance object storing container and of a reference position of the rotary table based on the deviation acquired in the first deviation acquiring step and the deviation acquired in the third deviation acquiring step.

6. The teaching method of the robot in the conveying system according to claim 5,
wherein the reference position of the rotary table is a rotation center of the rotary table, and
wherein the deviation of the disk-shaped conveyance object with respect to the reference position of the rotary table is a distance and a direction from the rotation center of the rotary table to a center of the disk-shaped conveyance object.

7. A conveying robot configured to take a disk-shaped conveyance object from a conveyance object storing container so as to convey and place the disk-shaped conveyance object on a rotary table of a conveyance object placing device including a rotary table which rotates in a horizontal plane and a sensor portion which acquires an information of a deviation of the disk-shaped conveyance object placed on the rotary table, the conveying robot comprising:

a base portion; and
an arm portion,
wherein an information of a position where the disk-shaped conveyance object is to be taken in the conveyance object storing container and of a position where the disk-shaped conveyance object is to be placed on the rotary table is acquired based on an information of the deviation of the disk-shaped conveyance object placed on the rotary table with respect to the reference position of the rotary table acquired by the sensor portion based on a taking position of the disk-shaped conveyance object in the conveyance object storing container and a position previously and temporarily set as the reference position of the rotary table so that an information of the taking position of the disk-shaped conveyance object in the conveyance object storing container by the robot and of the reference position of the rotary table is acquired based on the information of the positions thus acquired.

8. The conveying robot according to claim 7,
wherein the reference position of the rotary table is a rotation center of the rotary table, and
wherein the deviation of the disk-shaped conveyance object with respect to the reference position of the rotary table is a distance and a direction from the rotation center of the rotary table to a center of the disk-shaped conveyance object.

9. The conveying robot according to claim 7,
wherein the information of the deviation of the disk-shaped conveyance object placed on the rotary table with respect to the reference position of the rotary table acquired by the sensor portion comprises following three pieces of information;
a deviation of the disk-shaped conveyance object with respect to the reference position of the rotary table in a first placing position of the disk-shaped conveying object in the rotary table,
a deviation of the disk-shaped conveyance object with respect to the reference position of the rotary table in a second placing position where the disk-shaped conveyance object is moved horizontally and linearly by the robot in a distance previously set from the first placing position and placed on the rotary table, and
a deviation of the disk-shaped conveyance object with respect to the reference position of the rotary table in a third placing position where the disk-shaped conveyance object is moved by the robot horizontally and turningly at an angle previously set from the first placing position and placed on the rotary table.

10. The conveying robot according to claim 9,
wherein the reference position of the rotary table is a rotation center of the rotary table, and
wherein the deviation of the disk-shaped conveyance object with respect to the reference position of the rotary table is a distance and a direction from the rotation center of the rotary table to a center of the disk-shaped conveyance object.

* * * * *